United States Patent [19]
Ballantyne et al.

[11] Patent Number: 5,335,365
[45] Date of Patent: Aug. 2, 1994

[54] FREQUENCY SYNTHESIZER WITH VCO OUTPUT CONTROL

[75] Inventors: Wayne W. Ballantyne, Plantation; Leng H. Ooi, Sunrise; Eugene W. Hodges, III, Plantation, all of Fla.

[73] Assignee: Motorola, Inc., Schaumburg, Ill.

[21] Appl. No.: 117,749

[22] Filed: Sep. 7, 1993

Related U.S. Application Data

[63] Continuation of Ser. No. 726,661, Jul. 8, 1991, abandoned.

[51] Int. Cl.[5] ............................................. H04B 1/16
[52] U.S. Cl. ........................................ 455/76; 455/260; 455/265; 455/343; 331/14; 331/17; 331/25
[58] Field of Search ............. 455/75, 76, 165.1, 183.1, 455/196.1, 197.1, 260, 265, 343; 331/1 A, 14, 17, 25

[56] References Cited

U.S. PATENT DOCUMENTS

| | | | |
|---|---|---|---|
| 4,521,918 | 6/1985 | Challen | 455/343 |
| 4,625,180 | 11/1986 | Itaya et al. | 455/343 |
| 4,631,496 | 12/1986 | Borras et al. | 455/76 |
| 4,667,169 | 5/1987 | Matsuura et al. | 455/343 |
| 4,673,892 | 6/1987 | Miyashita et al. | 455/343 |
| 4,743,864 | 5/1988 | Nakagawa et al. | 455/343 |
| 4,893,094 | 1/1990 | Herold et al. | 455/343 |
| 4,955,075 | 9/1990 | Anderson | 455/343 |
| 5,103,192 | 4/1992 | Sekine et al. | 455/76 |

FOREIGN PATENT DOCUMENTS 0190032  9/1985  Japan ............................. 455/76

Primary Examiner—Reinhard J. Eisenzopf
Assistant Examiner—Andrew Faile
Attorney, Agent, or Firm—Robert S. Babayi

[57] ABSTRACT

A frequency synthesizer circuit, having first and second modes of operation, comprises a voltage-controlled oscillator (VCO) (64), a low-pass filter (74), a phase-locked loop (PLL) (67), an analog-to-digital converter (50), a digital-to-analog converter (56), a controller (48), and a VCO input switch. During the first mode, the VCO input switch couples the control input of the VCO to a control signal produced by the PLL, and the analog-to-digital converter measures the control signal and provides it to the controller which stores the control voltage measured by the analog-to-digital converter. During the second mode, the VCO input switch couples the control input of the VCO to the digital-to-analog converter which applies the stored control to the control input of the VCO.

10 Claims, 3 Drawing Sheets

FREQUENCY SYNTHESIZER WITH VCO OUTPUT CONTROL

This is a continuation of application Ser. No. 07/726,66, filed Jul. 8, 1991, and now abandoned.

TECHNICAL FIELD

This invention relates generally to radio communications and more specifically, to frequency synthesizers.

BACKGROUND OF THE INVENTION

Frequency synthesizers are widely used in modern portable radios because they provide several stable frequencies without the need of a crystal for each frequency of operation. For example, a known frequency synthesizer for use in a battery-powered two-way radio is shown in FIG. 1. The radio 10 comprises a receiver front end 12, a mixer 14, a first intermediate frequency (IF) stage 16, and a frequency synthesizer circuit. The frequency synthesizer circuit comprises a voltage-controlled oscillator (VCO) 18, a buffer 20, a divide-by-N frequency divider 22, a phase detector 26, a low-pass filter 28, and a buffer 30. A reference oscillator 24 provides a waveform having a reference frequency for mixing with the output signal of the VCO. This synthesizer is used to allow for programmability of the receive and transmit frequencies. One drawback of synthesizers, however, is that they consume more current than crystal-controlled oscillators. In particular, the high speed dividers 22, phase detector 26, and loop filter 28 (enclosed in dashed lines in FIG. 1) can draw significant amount of current (as much as 10 mA for an 800 MHz synthesizer). Moreover, since a portable radio, during typical usage, operates in the receive standby mode for 80–90% of the time, where the usual current drains are in the 40–60 mA range, the divider and phase detector current represent a significant percentage of the total standby current and therefore have an important impact on total battery life.

An example of a battery saver frequency synthesizer arrangement was taught in U.S. Pat. No. 4,521,918 to Challen (1985). Challen teaches replacing a control voltage produced by a PLL synthesizer with an automatic frequency control voltage produced by the discriminator, and interrupting power to the PLL synthesizer, during a battery saver mode. However, the Challen approach is limited to use in a strong RF environment, since it depended on the automatic frequency control (AFC) feedback loop using the discriminator output, which becomes noisy when the RF carrier signal is weak. While the average signal level can be monitored by having a microcontroller read the received signal strength indicator (RSSI) signal from the IF stage, and therefore decide when to use the battery saver scheme, a sudden RF fade could cause unreliable VCO operation for several tens of milliseconds before the microcontroller can react and switch back to standard synthesizer operation. Another drawback of the Challen approach is its requirement that an RF carrier be present at all times so as to be able to generate a valid discriminator signal to control the AFC feedback loop. This requirement limits its usefulness to a trunked system in which the control channel is always active. Thus, a need exists for a frequency synthesizer that operates in a battery saver mode, and avoids the detriments of the prior art.

SUMMARY OF THE INVENTION

Briefly, according to the invention, a frequency synthesizer circuit has a phase-lock mode of operation and a battery-saver mode of operation. The frequency synthesizer circuit comprises a voltage-controlled oscillator (VCO) having a control input for receiving a control voltage and phase-locked loop (PLL) means for comparing an output from the VCO with a signal from a reference oscillator to provide a first control voltage. A control means includes an input coupled to the control input of the VCO for sampling the first control voltage during the phase-lock mode, and an output for providing a second control voltage, the second voltage representing a value of the first control voltage sampled during the phase-lock mode. A switch means selectively couples the first control voltage to the control input of the VCO during the phase-lock mode, and alternatively, couples the second control voltage to the control input of the VCO during the battery-saver mode.

DETAILED DESCRIPTION OF THE PREFERRED EMBODIMENT

Figure 1:
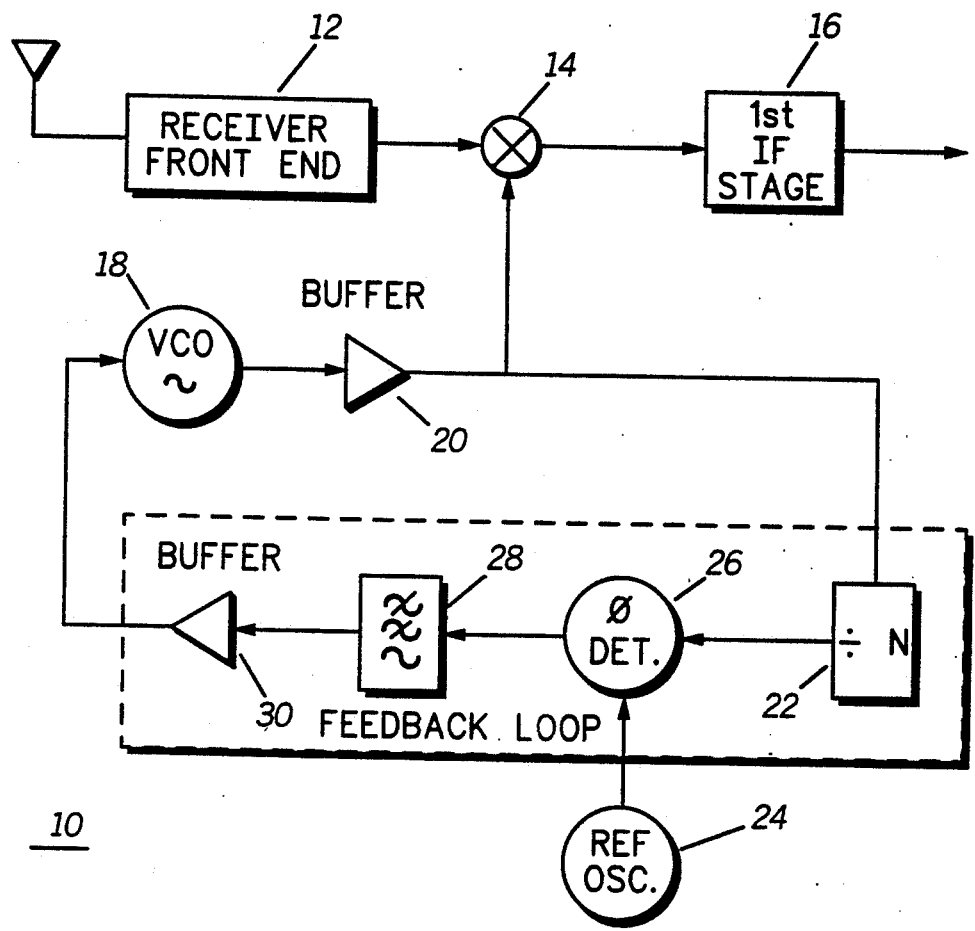
FIG. 1 shows a known frequency synthesizer for use in a battery-powered two-way radio.
Figure 2:
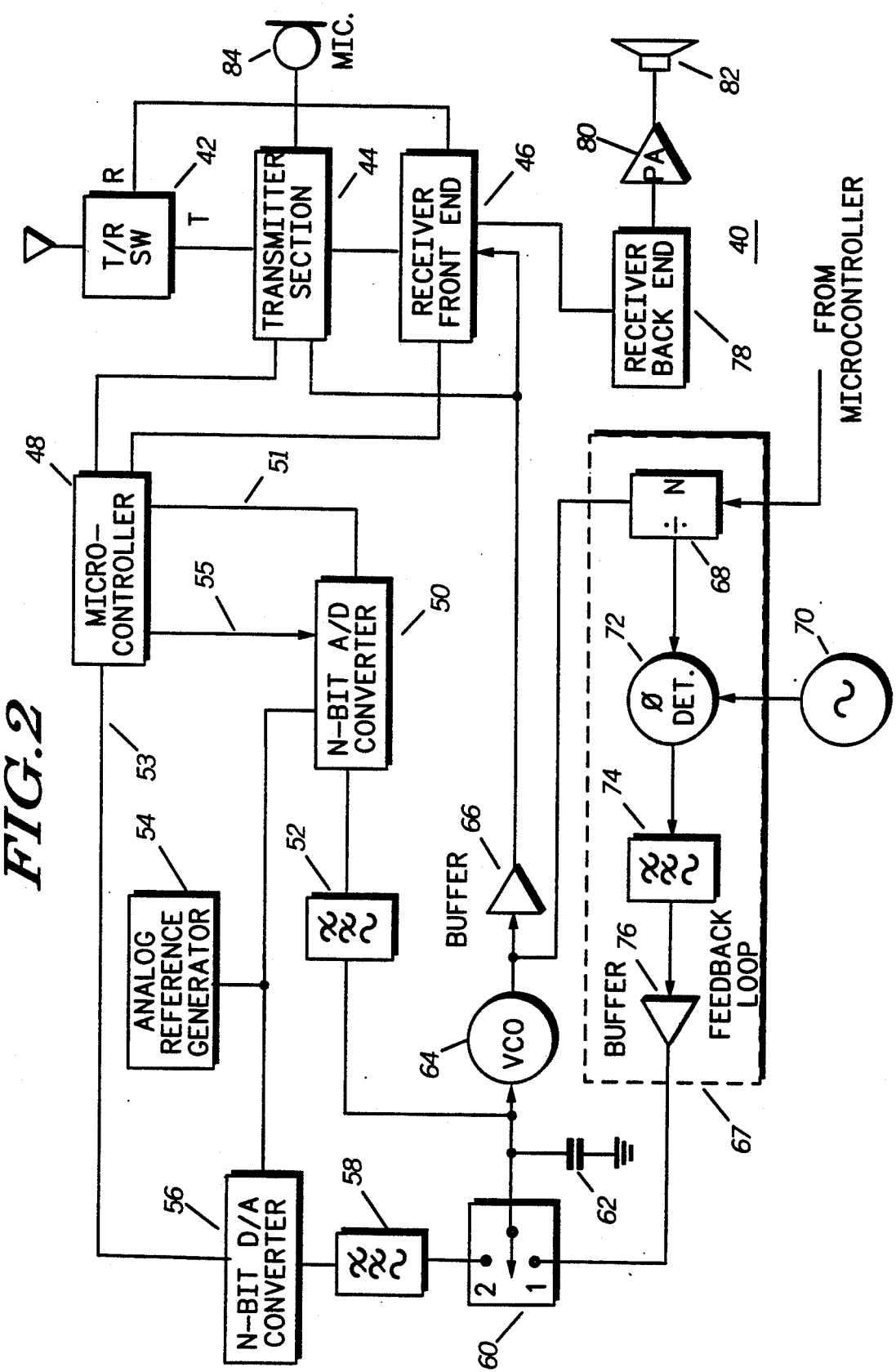
FIG. 2 shows a radio having a frequency synthesizer in accordance with the invention.

Referring to FIG. 2, there is shown a radio circuit 40 having a phase-lock mode of operation and a battery-saver mode of operation, in accordance with the invention. The scheme illustrated in FIG. 2 substantially eliminates the extra current consumption associated with the use of a high-speed frequency divider during a receive standby mode, while still retaining the flexibility provided by the synthesizer. The battery-saving method of the invention is utilized only in a receive standby mode, when no audio is being heard by the user and no RF is being transmitted. Therefore, any minor frequency transients caused by the switching activity associated with the method will not be heard nor will they cause any out of band RF transients to be transmitted.

The radio circuit 40 comprises a transmit/receive switch 42, a conventional transmitter section 44, a conventional receiver front end 46, a microcontroller 48 (e.g., a conventional microprocessor), a receiver back end 78, a power amplifier 80, a microphone 84, and a speaker 82. The radio circuit 40 also comprises an N-bit analog-to-digital (A/D) converter 50 and an N-bit digital-to-analog (D/A) converter 56, coupled (51 and 53) to the microcontroller 48. A voltage-controlled oscillator (VCO) 64 provides waveforms, having a number of selectable frequencies, to the receiver front end 46 (and possibly the transmitter section 44). The buffer/amplifier 66 provides a gain stage to drive a mixer within the receiver 46. The output of the VCO 64 is locked to a selected frequency by means of a Phase-locked loop (PLL) feedback 67. The PLL feedback 67 includes a divide-by-N frequency divider 68, a phase detector 72, for detecting the difference in the phase of the output of the VCO and a reference signal produced by a reference oscillator 70, loop filter 74, and a buffer 76 for matching purposes. The VCO 64 has a control input (or electrode) for receiving a control voltage that sets the frequency of the output of the VCO 64. An input switch 60 applies the control voltage to the VCO control input when the switch is in a position #1. A capacitor 62 is disposed between the control input of the VCO 64 and ground, to hold the voltage at the VCO control electrode during switching. Thus, with the VCO input switch 60 in position #1, the circuit functions as a normal frequency synthesizer. A low pass filter 52 is disposed between the input switch 60 and the D/A converter 56 to reduce noise from the D/A converter 56.

Examples of integrated circuits (ICs) which may be used in accorance with the invention in the D/A converter block 56 are the Analog Devices 16-bit D/A converter using the AD586 5 V reference, the AD1145 16-bit A/D converter, and the AD711 precision op-amp. The specified typical current drains for these three ICs are 2.0, 0.5, and 2.5 mA, respectively, which results in a total drain of 5.0 mA. The AD586 could be replaced by the National LP2951C 5 V regulator, which has a no-load drain of only 100 uA and comparable specification otherwise. The precision op-amp can be avoided since the D/A converter is used only to apply voltage to a varactor, which has a very high DC impedance. This means that a 16-bit D/A converter with less than 1 mA of current drain can be realized.

Figure 3:
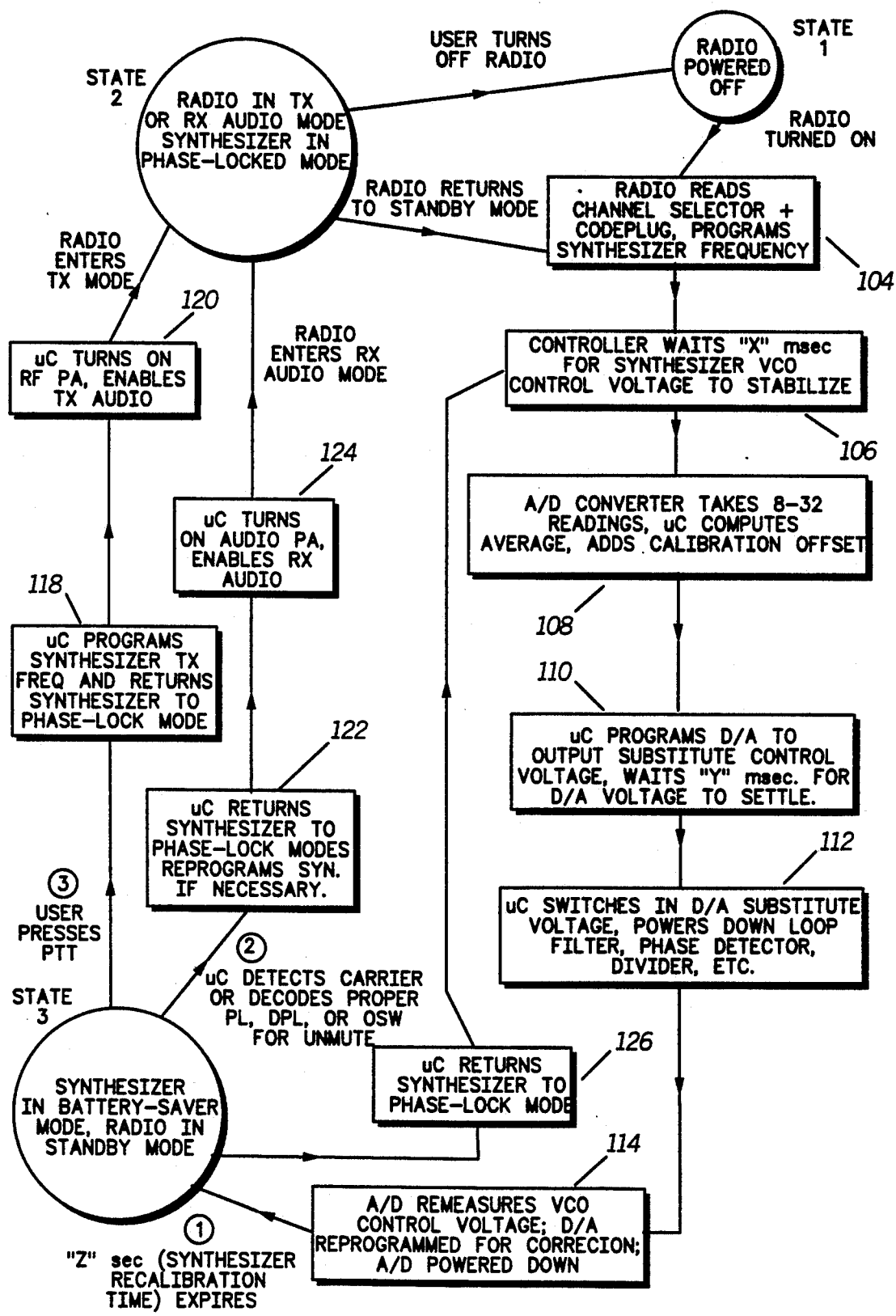
FIG. 3 shows a state-transition diagram of a frequency synthesis method in accordance with the invention.

Referring to FIG. 3, a state transition diagram describes a method in accordance with the invention. In state 1, the radio is off. When the radio 40 is first turned on, it enters a receive standby mode (in step 104), the microcontroller 48 programs the desired receive frequency data into the divider 68, and configures the VCO input switch 60 for Position #1. At this point the radio is in the phase-lock mode. After waiting a predetermined amount of time (X msec) for the synthesizer to lock and the VCO control voltage to stabilize, the A/D converter 50 then begins to take between 8 and 32 readings of the control voltage. These values are read by the microcontroller 48 and then averaged (in step 108). Any calibration offset of the computed average voltage would then be subtracted to allow for any known (presumably measured in a factory test system during production) mismatch between the A/D and D/A converter accuracies.

The radio 40 then switches to the battery saver mode. This is effected by first programming the D/A converter 56 to output the same voltage that was read by the A/D converter 50. After allowing time (Y msec) for the D/A converter 56 output to stabilize (in step 110), the microcontroller changes the VCO input switch 60 to position #2 and enables the power down control line 55 to the synthesizer and the A/D converter 50. In step 114, the A/D converter 50 (optionally) remeasures the VCO control voltage and the microcontroller 48 reprograms the D/A converter 56 for correction of the substitute VCO control voltage. The A/D converter 50 is then powered down. At this point the radio 40 is in the battery-saver mode (i.e., state 3). The microcontroller initiates a timer which is used to periodically recalibrate the synthesizer. Since the VCO receives the same DC control voltage as was output by the feedback loop 67, the RF frequency it generates is nearly the same, with any slight errors being due to D/A quantization. The power down control signal will cause the circuitry associated with the feedback loop 67 and the A/D converter 50 to go to a low power mode in which the total synthesizer current consumed is substantially reduced. In particular, the frequency divider 68 is disabled, but it will retain its programmed divider values.

The synthesizer remains in the battery saver mode: (1) for at least "Z" seconds (tracked by the microcontroller timer), (2) until receiver signalling data is decoded, instructing the radio 40 to unmute, or (3) until the user presses the PTT or emergency buttons and the radio 40 keys up. The battery saver mode is disabled during all transmit activity and while the user is receiving audio.

The above method can be refined by having the A/D converter 50 measure the substituted D/A controller voltage (provided by the D/A converter 56) and verify that it is the same (within a predefined error limit) as the control voltage measured while the synthesizer is in the phase lock mode. If it is not, a correction to the programmed D/A 56 would be programmed. This would improve the frequency accuracy of the scheme, especially at temperature extremes.

In step 126, the microcontroller returns the radio 40 to the phase-lock mode after the microcontroller timer has counted "Z" seconds. Then the process continues to step 106.

The battery-saver timeout period, "Z" seconds, is primarily a function of the VCO frequency drift due to internal temperature or humidity changes. When the Z seconds expire, the microcontroller 48 initiates a synthesizer recalibration by returning the synthesizer to phase-lock mode by powering up the phase-detector 72, divider 68, and other feedback loop 67 elements, and setting the switch 60 to position #1. Note that since it is assumed that the divider 72 retains its programmed value even while in the low-power (battery saver) mode, there is no need to reprogram it. If the divider 72 is in fact fabricated using the BiCMOS technology, it is reasonable to assume that it could retain its programmed value while still consuming an insignificant amount of current (<500 micro amps).

When the microcontroller detects a received carrier signal, or any kind of valid data signal (e.g., a trunking outbound signalling word signal directing the radio 40 to a voice channel) then the process continues at step 122. In step 122, the microcontroller 48 returns the synthesizer to the phase-lock mode, and reprograms the synthesizer, if required. Reprogramming the synthesizer is required when, for example, a-switch is made to voice transmission in a trunked system.

In step 124, the microcontroller 48 turns on the audio power amplifier 80 (in FIG. 2), and enables the receiver audio. Then the process continues to state 2, in which the radio is in a transmit or receive audio mode, and the synthesizer in in the phase-lock mode.

When the radio user presses the push-to-talk (PTT) switch, the microcontroller 48 programs the synthesizer transmit frequency and returns to the phase-lock mode. In step 120, the microcontroller 48 turns on the radio-frequency power amplifier, and enables the microphne audio 84. The radio 40 then enters the transmit mode to continue to state 2. When the user releases the PTT button, the received carrier disappears, or correct data signalling is no longer received, the radio then returns to step 104.

The total amount of current reduction that can be achieved is primarily dependent on the sum of the currents of the high-speed divider 68, phase detector 72, loop filter 74, and buffer 76, minus the current of the D/A converter 56 subsystem. Secondarily, it is dependent on the "duty cycle" of the calibration time, which is basically the percentage of time that the CPU keeps the synthesizer in the battery saver mode.

The design of the A/D and D/A converters is critical to the accuracy of the VCO output frequency while in the battery saver mode. First of all, the converters must have enough resolution to provide the required frequency accuracy. The basic equation is given by:

(1) M = number of steps $= 2^N \geq \Delta f / f_R$, where M is defined as the total number of frequency increments; N is the number of bits of A/D and D/A converter resolution; $f_R$ is the total VCO frequency range required; and $\Delta f$ is the frequency resolution required, dictated by, system level requirements for the portable radio.

For example, suppose the VCO output frequency is desired to vary over a 20 MHz range in the 800 MHz band, with frequency accuracy to 500 Hz. The required number of increments is $M = (20E+6)/500 = 40,000$. Since $2^{16} = 65536 > 40,000$, a 16-bit D/A and A/D converter subsystem would be needed.

Having established the required frequency resolution, the accuracy of the D/A and A/D converter subsystem must be considered. The mismatch between the initial VCO control voltage and the substituted output of the D/A converter should ideally be no more than $+/- \frac{1}{2}$ LSB of voltage resolution. This suggests that, first of all, the A/D and D/A converters 50 and 56 should share the same analog reference provided by an analog reference generator 54 (shown in FIG. 2). Secondly, any tracking errors between the digitized A/D input and the D/A output for the digital word read by the A/D should be ideally zero or at least in the form of a repeatable DC offset that can be calibrated by an automated test system in the radio test facility.

The effectiveness of the entire scheme is dependent on being able to use a low-power D/A subsystem which normally includes a voltage reference, D/A converter, and sometimes a precision voltage follower. The current drain of the D/A converter is 56 expected to be significantly less than that consumed by the synthesizer components that are being powered down.

Therefore, a frequency synthesizer circuit is provided that operates in a battery saver mode, and avoids the detriments of the prior art.

What is claimed is:

1. A frequency synthesizer circuit having a phase-lock mode of operation and a battery-saver mode of operation, the frequency synthesizer circuit comprising:
   a voltage-controlled oscillator (VCO) having a control input;
   a capacitor coupled to said control input;
   phase-locked loop (PLL) means for comparing an output from the VCO with a reference signal to provide a first control voltage;
   control means having an input for receiving and sampling the first control voltage during the phase-lock mode, and an output for providing a second control voltage, the second control voltage representing a value of the first control voltage sampled during the phase-lock mode; and
   switch means for selectively coupling the first control voltage to the capacitor during the phase-lock mode, and for coupling the second control voltage to the capacitor during the battery-saver mode in order to maintain a substantially constant control voltage at the control input of the VCO.

2. The frequency synthesizer circuit of claim 1 wherein:
   the control means comprises a microcontroller having an analog-to-digital converter input for receiving the first control voltage, and a digital-to-analog converter output for providing the second control voltage.

3. A frequency synthesis method, comprising the steps of:
   (a) generating, with a phase-locked-loop (PLL) means, a first control voltage for controlling a voltage-controlled oscillator (VCO) having a control input;
   (b) sampling with a control means, the first control voltage;
   (c) generating a second control signal for controlling the voltage-controlled oscillator, the second control signal being a sampled representation of the first control signal;
   (d) coupling the first control voltage to a capacitor which is coupled to the control input of the VCO during a phase-lock mode when the PLL means is phase locked; and
   (e) decoupling the first control voltage from the VCO, and coupling the second control voltage to the capacitor during a battery-saver mode when the power consumption of the PLL means is reduced in order to maintain a substantially constant control voltage at the control input of the VCO.

4. In a communication device including a voltage-controlled oscillator, a capacitor coupled to the voltage controlled oscillator, a phase-locked loop synthesizer means, an analog-to-digital converter, and digital-to-analog converter, a frequency synthesis method, comprising the steps of:
   (a) producing, with the phase-locked loop synthesizer means, a first control voltage, during a phase-lock mode where the PLL means is phase locked;
   (b) sampling the first control voltage using the analog-to-digital converter during the phase-lock mode;
   (c) storing a digitized version of the first control voltage sampled in step (b);
   (d) switching to a battery saver mode where the power consumption of the PLL means is reduced; and
   (e) producing a second control voltage using the digital-to-analog converter, during the battery saver mode, the second control voltage representing the digitized version of the first control voltage that was stored in step (c);
   (f) applying the second control voltage to the capacitor during battery-saver mode in order to maintain a substantially constant control voltage at the control input of the VCO.

5. The frequency synthesis method of claim 4, further comprising the step of:
   (a 1) reading a channel selector, and programming a frequency for the phase-locked loop synthesizer means.

6. The frequency synthesis method of claim 5, further comprising the step of:
   (a 2) waiting for a first predetermined time interval for the first control voltage to stabilize.

7. The frequency synthesis method of claim 6, further comprising the steps of:
   (b 1) taking at least eight samples of the first control voltage, with the the control means and the analog-to-digital converter;

(b 2) averaging the at least eight samples of the first control voltage to produce a computed average voltage; and (b 2) subtracting any calibration offset of the computed average voltage from the computed average voltage.

8. The frequency synthesis method of claim 6, further comprising the steps of:

(d 1) reducing the power input to the phase-locked loop synthesizer means and to the analog-to-digital converter.

9. The frequency synthesis method of claim 4, further comprising the step of:

(f) periodically returning to the phase-lock mode to recalibrate the second control voltage to compensate for any VCO drifts due to temperature or humidity changes.

10. In a communication device including a voltage-controlled oscillator, a capacitor coupled to the voltage controlled oscillator, a phase-locked loop synthesizer means, an analog-to-digital converter, and digital-to-analog converter, a frequency synthesis method, comprising the steps of:

(a) producing, with the phase-locked loop synthesizer means, a first control voltage, during a phase-lock mode where the PLL means is phase locked;

(b) sampling the first control voltage using the analog-to-digital converter during the phase-lock mode;

(c) storing a digitized version of the first control voltage sampled in step (b);

(d) switching to a battery saver mode where the power consumption of the PLL means is reduced; and (e) producing a second control voltage using the digital to analog converter, during the battery saver mode, the second control voltage representing the digitized version of the first control voltage that was stored in step (c), (f) applying the second control voltage to the capacitor during battery-saver mode in order to maintain a substantially constant control voltage at the control input of the VCO;

(g) measuring a level of the second control voltage;

(h) comparing the level of the second voltage with a digitized version of the first control voltage;

(i) reprogramming the digital-to-analog converter to obtain an estimate of the first control voltage more accurate than the second control voltage, and powering down the analog-to-digital converter.

* * * * *